United States Patent
Okuno et al.

(10) Patent No.: US 11,125,803 B2
(45) Date of Patent: Sep. 21, 2021

(54) METHOD OF MEASURING SEMICONDUCTOR DEVICE BY APPLYING VOLTAGE TO THE SEMICONDUCTOR DEVICE USING PROBE NEEDLE

(71) Applicant: Mitsubishi Electric Corporation, Tokyo (JP)

(72) Inventors: Koji Okuno, Tokyo (JP); Shozo Shikama, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 48 days.

(21) Appl. No.: 16/315,205

(22) PCT Filed: Sep. 1, 2016

(86) PCT No.: PCT/JP2016/075618
§ 371 (c)(1),
(2) Date: Jan. 4, 2019

(87) PCT Pub. No.: WO2018/042585
PCT Pub. Date: Mar. 8, 2018

(65) Prior Publication Data
US 2019/0310306 A1 Oct. 10, 2019

(51) Int. Cl.
*G01R 31/26* (2020.01)
*G01R 1/067* (2006.01)
(Continued)

(52) U.S. Cl.
CPC ...... *G01R 31/2601* (2013.01); *G01R 1/06711* (2013.01); *H01L 29/1608* (2013.01); *H01L 29/872* (2013.01)

(58) Field of Classification Search
CPC .............. G01R 31/2601; H01L 29/872; H01L 29/0619; H01L 29/0692; H01L 29/1608
See application file for complete search history.

(56) References Cited

U.S. PATENT DOCUMENTS 6,831,345 B2 * 12/2004 Kinoshita ........... H01L 29/0619
257/492
9,111,769 B2 * 8/2015 Aketa ..................... H01L 29/36
(Continued)

FOREIGN PATENT DOCUMENTS

JP 2010-003841 A 1/2010
JP 2011-060939 A 3/2011
(Continued)

OTHER PUBLICATIONS

An Office Action; "Notification of Reasons for Refusal," issued by the Japanese Patent Office dated Feb. 5, 2019, which corresponds to Japanese Patent Application No. 2018-536609 and is related to U.S. Appl. No. 16/315,205; with English language translation.
(Continued)

*Primary Examiner* — Minh N Tang
(74) *Attorney, Agent, or Firm* — Studebaker & Brackett PC

(57) ABSTRACT

The present application relates to a technique of reducing the occurrence of a spot breakdown near a probe needle with the intention of preventing damage on the probe needle during a test implemented by applying a high voltage to a semiconductor device. In a method of measuring a semiconductor device, the semiconductor device includes: a semiconductor substrate (1), an epitaxial layer (2), at least one second conductivity type region (3) of a second conductivity type formed in a part of the surface layer of the epitaxial layer to have a contour, a Schottky electrode (11), an anode electrode (12), and a cathode electrode (13). A voltage is applied while the probe needle (21) is brought into contact with the upper surface of the anode electrode in a range in which the contour of the at least one second conductivity type region is formed in a plan view.

9 Claims, 16 Drawing Sheets

(51) Int. Cl.
  *H01L 29/16* (2006.01)
  *H01L 29/872* (2006.01)

(56) References Cited

U.S. PATENT DOCUMENTS

| | | | |
|---|---|---|---|
| 2005/0139947 A1* | 6/2005 | Okada | H01L 29/861 |
| | | | 257/480 |
| 2009/0236611 A1* | 9/2009 | Yamamoto | H01L 29/0611 |
| | | | 257/77 |
| 2009/0267082 A1* | 10/2009 | Yamamoto | H01L 21/0495 |
| | | | 257/77 |
| 2010/0314629 A1* | 12/2010 | Tarui | H01L 29/1095 |
| | | | 257/77 |
| 2011/0059597 A1 | 3/2011 | Nishio et al. | |
| 2014/0342544 A1 | 11/2014 | Akiyama et al. | |
| 2014/0363906 A1 | 12/2014 | Otsuki et al. | |
| 2015/0041828 A1* | 2/2015 | Nagao | H01L 29/0692 |
| | | | 257/77 |

FOREIGN PATENT DOCUMENTS

| | | | |
|---|---|---|---|
| JP | 2012-069567 A | 4/2012 | |
| JP | 2012-156154 A | 8/2012 | |
| JP | 2013-118213 A | 6/2013 | |
| JP | 2014-229651 A | 12/2014 | |
| JP | 2014-238332 A | 12/2014 | |

OTHER PUBLICATIONS

International Search Report issued in PCT/JP2016/075618; dated Dec. 6, 2016.

* cited by examiner

F I G . 1
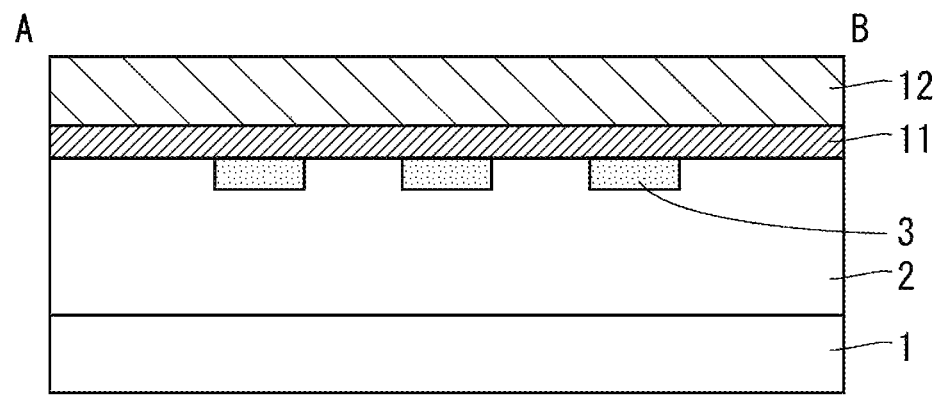
F I G . 2
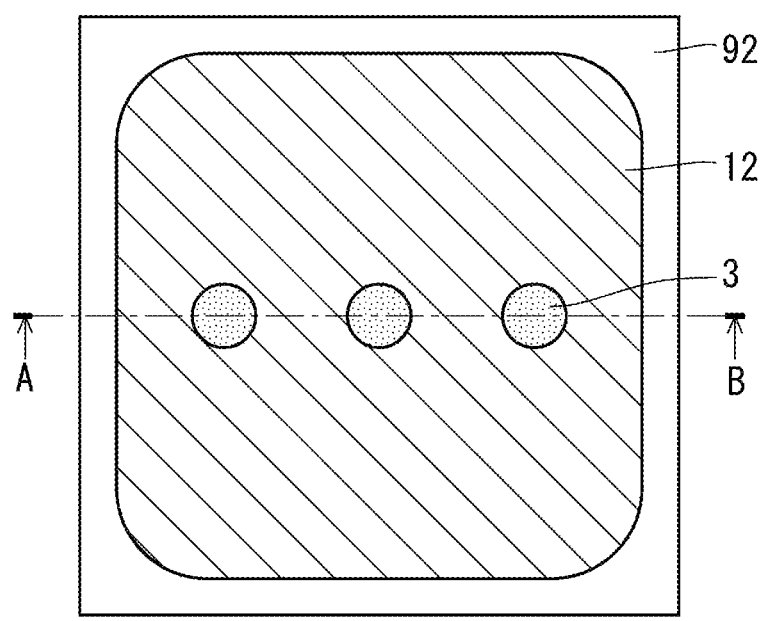

F I G . 2 2
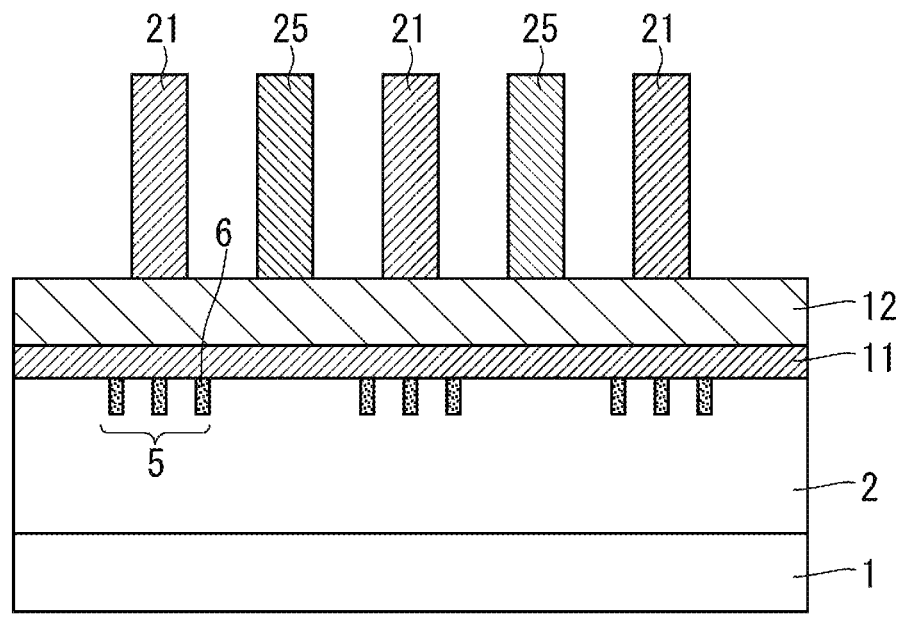
F I G . 2 3
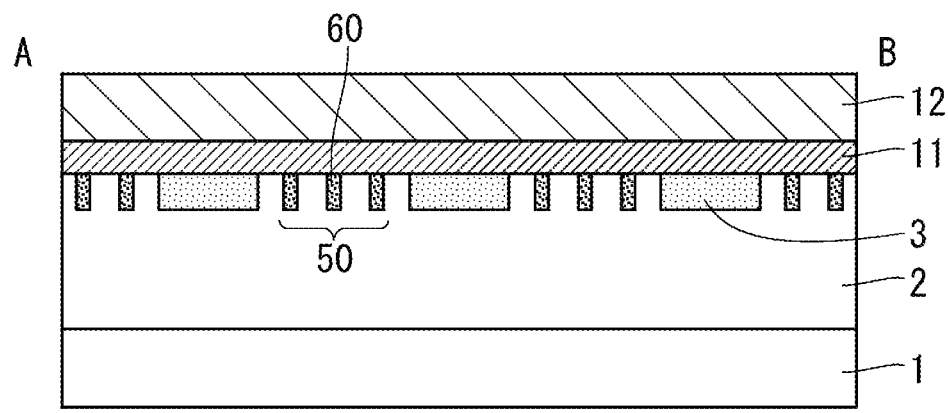

F I G . 3 3
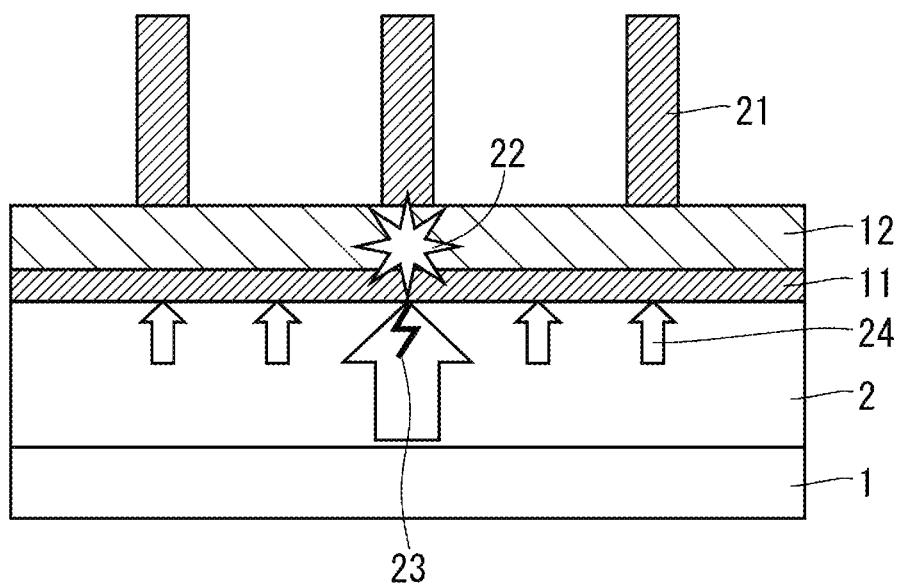

METHOD OF MEASURING SEMICONDUCTOR DEVICE BY APPLYING VOLTAGE TO THE SEMICONDUCTOR DEVICE USING PROBE NEEDLE

TECHNICAL FIELD

A technique disclosed in the description of the present application relates to a method of measuring a semiconductor device.

BACKGROUND ART

As described in patent document 1 (Japanese Patent Application Laid-Open No. 2014-229651, for example), if a test is implemented by applying a high voltage to a Schottky barrier diode (specifically, an SBD) using silicon carbide (SiC) or a junction barrier controlled Schottky diode (JBS) using silicon carbide (SiC), a spot breakdown may be caused by a crystal defect in SiC.

In a conventional semiconductor chip, a region in which a current is to flow has a uniform configuration. In such a semiconductor chip, the foregoing spot breakdown may occur, particularly near a probe needle for measurement.

If the spot breakdown occurs near the probe needle for measurement, the probe needle is damaged caused during the breakdown. This has necessitated interruption of the test and exchange of the probe needle.

PRIOR ART DOCUMENTS

Patent Documents

Patent Document 1: Japanese Patent Application Laid-Open No. 2014-229651

SUMMARY

Problem to be Solved by the Invention

As described above, in the conventional SiC-SBD or SiC-JBS, the test implemented by applying a high voltage may cause a spot breakdown due to a crystal defect in SiC.

This spot breakdown is caused by thermal breakdown occurring in response to positive feedback in which a high leakage current is generated and starts to flow from the crystal defect to generate heat, and the generated heat increases the leakage current.

If this thermal breakdown occurs near the probe needle, the probe needle is damaged by adherence of an electrode melted and sputtered to the probe needle, or deformation of the probe needle itself by the heat.

If measurement continues while such damage remains unsolved, measurement failure may be caused by assembly failure due to an increased mark of contact with an electrode or malfunction due to damage on a surface of a semiconductor device at a lower part of the electrode, for example.

Hence, the occurrence of the spot breakdown near the probe needle has necessitated interruption of the test and exchange of the probe needle. In particular, if the test is implemented on a semiconductor device using a semiconductor material involving a large number of crystal defects in the semiconductor device such as silicon carbide (SiC), for example, the occurrences of a large number of spot breakdowns necessitates interruption of the test and exchange of the probe needle more frequently. This causes the problem of reducing processing capacity.

The technique disclosed in the description of the present application has been made to solve the foregoing problem, and relates to a technique of reducing the occurrence of a spot breakdown near a probe needle with the intention of preventing damage on the probe needle during a test implemented by applying a high voltage to a semiconductor device.

Means to Solve the Problem

A first aspect of the technique disclosed in the description of the present application is intended for a method of measuring a semiconductor device implemented by applying a voltage to the semiconductor device using a probe needle. The semiconductor device includes: a semiconductor substrate of a first conductivity type; an epitaxial layer of the first conductivity type formed on the upper surface of the semiconductor substrate; at least one second conductivity type region of a second conductivity type formed in a part of the surface layer of the epitaxial layer to have a contour; a Schottky electrode formed to cover the upper surface of the epitaxial layer and the upper surface of the second conductivity type region; an anode electrode formed on the upper surface of the Schottky electrode; and a cathode electrode formed on the lower surface of the semiconductor substrate. A voltage is applied while the probe needle is brought into contact with the upper surface of the anode electrode in a range in which the contour of the at least one second conductivity type region is formed in a plan view.

A second aspect of the technique disclosed in the description of the present application is intended for a method of measuring a semiconductor device implemented by applying a voltage to the semiconductor device using a probe needle. The semiconductor device includes: a semiconductor substrate of a first conductivity type; an epitaxial layer of the first conductivity type formed on the upper surface of the semiconductor substrate; at least one first Schottky electrode formed on the upper surface of the epitaxial layer; at least one second Schottky electrode formed on the upper surface of the epitaxial layer and forming a Schottky barrier between the second Schottky electrode and the epitaxial layer higher than a Schottky barrier formed between the first Schottky electrode and the epitaxial layer; an anode electrode formed on the upper surface of the first Schottky electrode and the upper surface of the second Schottky electrode; and a cathode electrode formed on the lower surface of the semiconductor substrate. A voltage is applied while the probe needle is brought into contact with the upper surface of the anode electrode in a range in which the at least one second Schottky electrode is formed in a plan view.

Effects of the Invention

The first aspect of the technique disclosed in the description of the present application is intended for the method of measuring a semiconductor device implemented by applying a voltage to the semiconductor device using the probe needle. The semiconductor device includes: the semiconductor substrate of the first conductivity type; the epitaxial layer of the first conductivity type formed on the upper surface of the semiconductor substrate; the at least one second conductivity type region of the second conductivity type formed in a part of the surface layer of the epitaxial layer to have a contour; the Schottky electrode formed to cover the upper surface of the epitaxial layer and the upper surface of the second conductivity type region; the anode electrode formed on the upper surface of the Schottky electrode; and the cathode electrode formed on the lower surface of the semiconductor substrate. A voltage is applied while the probe needle is brought into contact with the upper surface of the anode electrode in a range in which the contour of the at least one second conductivity type region is formed in a plan view. This configuration makes it possible to reduce the occurrence of a spot breakdown near the probe needle.

The second aspect of the technique disclosed in the description of the present application is intended for the method of measuring a semiconductor device implemented by applying a voltage to the semiconductor device using the probe needle. The semiconductor device includes: the semiconductor substrate of the first conductivity type; the epitaxial layer of the first conductivity type formed on the upper surface of the semiconductor substrate; the at least one first Schottky electrode formed on the upper surface of the epitaxial layer; the at least one second Schottky electrode formed on the upper surface of the epitaxial layer and forming a Schottky barrier between the second Schottky electrode and the epitaxial layer higher than a Schottky barrier formed between the first Schottky electrode and the epitaxial layer; the anode electrode formed on the upper surface of the first Schottky electrode and the upper surface of the second Schottky electrode; and the cathode electrode formed on the lower surface of the semiconductor substrate. A voltage is applied while the probe needle is brought into contact with the upper surface of the anode electrode in a range in which the at least one second Schottky electrode is formed in a plan view. This configuration makes it possible to reduce the occurrence of a spot breakdown near the probe needle.

These and other objects, features, aspects and advantages of the technique disclosed in the description of the present application will become more apparent from the following detailed description when taken in conjunction with the accompanying drawings.

BRIEF DESCRIPTION OF DRAWINGS

FIG. 1 is a sectional view schematically illustrating the configuration in part of a semiconductor device relating to an embodiment.

FIG. 2 is a plan view schematically illustrating the configuration in part of the semiconductor device relating to the embodiment.

FIG. 22 is a sectional view illustrating how a test is implemented by applying a voltage using the semiconductor device relating to the embodiment.

FIG. 23 is a sectional view schematically illustrating the configuration of the semiconductor device relating to the embodiment.

FIG. 33 is a sectional view for showing the mechanism of causing the spot breakdown relating to the embodiment.

DESCRIPTION OF EMBODIMENT(S)

Figure 3:
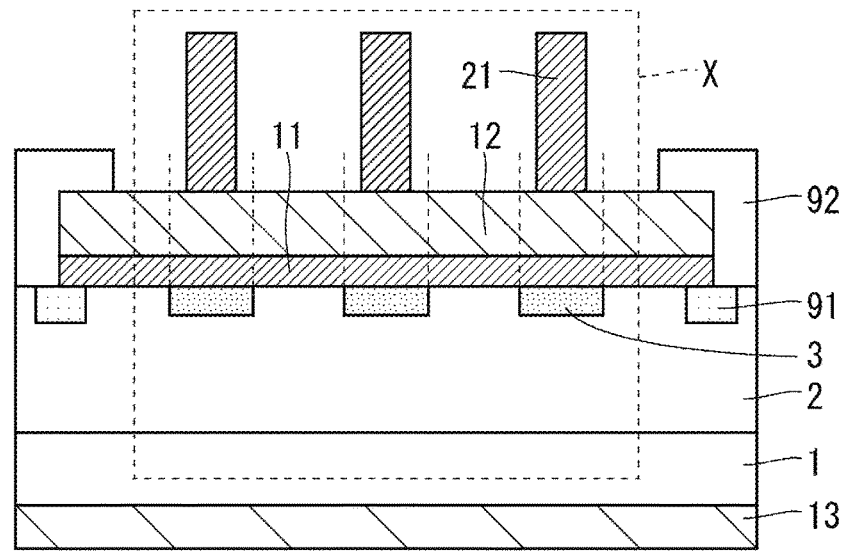
FIG. 3 is a sectional view schematically illustrating the configuration in its entirety of the semiconductor device relating to the embodiment.

An embodiment will be described below by referring to the accompanying drawings.

The drawings are presented schematically. For the convenience of description, a structure is omitted or simplified, where appropriate. Correlations in terms of size and position between structures, etc. shown in different drawings are not always illustrated correctly but are changeable, where appropriate.

In the description given below, similar components will be given the same sign and illustrated with the same sign in the drawings. These components will be given the same name and are to fulfill the same function. Thus, to avoid duplication, detailed description of these components may be omitted.

In the description given below, a term meaning a particular position or a particular direction such as "upper," "lower," "side", "bottom," "front," or "back" is used. These terms are used for the purpose of convenience to facilitate understanding of the substance of the embodiment, and do not relate to directions in actual use.

In the description given below, an ordinal number such as "first" or "second" may be used. These terms are used for the purpose of convenience to facilitate understanding of the substance of the embodiment, and are not intended to limit order that might be defined by these terms.

First Embodiment

A method of measuring a semiconductor device relating to a first embodiment will be described below. For the convenience of description, a spot breakdown and a mechanism of causing the spot breakdown will be described first.

In the description given below, a first conductivity type corresponds to an n type, and a second conductivity type corresponds to a p type.

Figure 28:
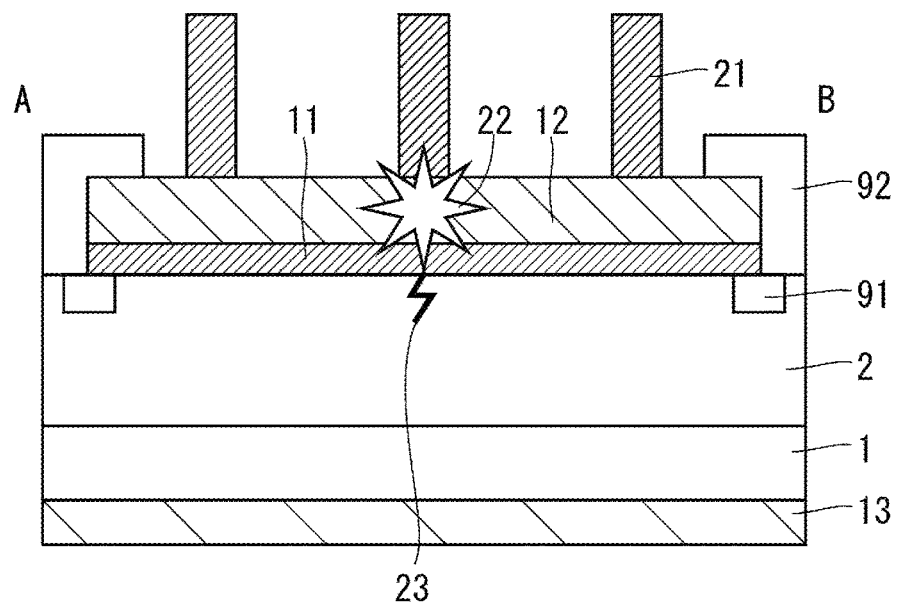
FIG. 28 is a sectional view illustrating the semiconductor device relating to the embodiment on the occurrence of a spot breakdown.
Figure 29:
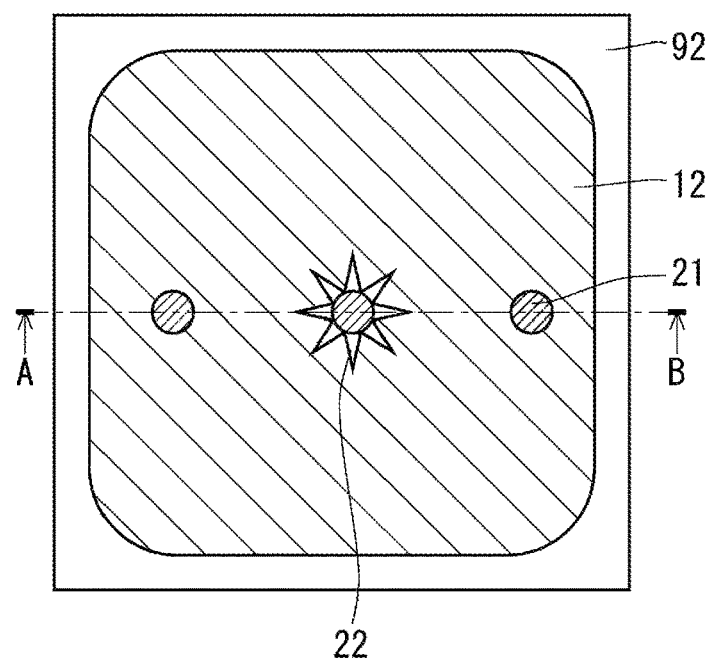
FIG. 29 is a plan view of the configuration illustrated in FIG. 28.
Figure 30:
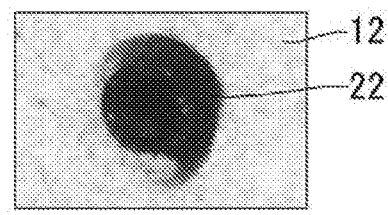
FIG. 30 illustrates the occurrence of a spot breakdown relating to the embodiment.

FIG. 28 is a sectional view illustrating the semiconductor device on the occurrence of a spot breakdown. FIG. 29 is a plan view of the configuration illustrated in FIG. 28. FIG. 30 illustrates the occurrence of a spot breakdown 22.

As illustrated in FIG. 28, the semiconductor device relating to this embodiment includes an $n^+$ type silicon carbide semiconductor substrate 1, an $n^-$ type epitaxial layer 2 formed on the upper surface of the $n^+$ type silicon carbide semiconductor substrate 1, a Schottky electrode 11 formed on the upper surface of the epitaxial layer 2, and an anode electrode 12 formed on the upper surface of the Schottky electrode 11.

The semiconductor device relating to this embodiment includes a p-type terminal breakdown voltage holding layer 91 formed in the surface layer of the epitaxial layer 2 to surround the Schottky electrode 11 in a plan view. The terminal breakdown voltage holding layer 91 is joined in a partial region to the Schottky electrode 11.

The semiconductor device relating to this embodiment includes a terminal protective film 92 formed to cover the Schottky electrode 11 and the anode electrode 12, and a cathode electrode 13 formed on the lower surface of the silicon carbide semiconductor substrate 1.

The anode electrode 12 of the semiconductor device relating to this embodiment has an upper surface to be contacted by a plurality of probe needles 21.

A crystal defect 23 occurring in the semiconductor device having the foregoing configuration may cause the spot breakdown 22 near the probe needle 21.

If the spot breakdown 22 occurs near the probe needle 21 for measurement, the probe needle 21 is damaged by the breakdown. This has necessitated interruption of a test and exchange of the probe needle.

A mechanism of causing a spot breakdown will be described next.

Figure 31:
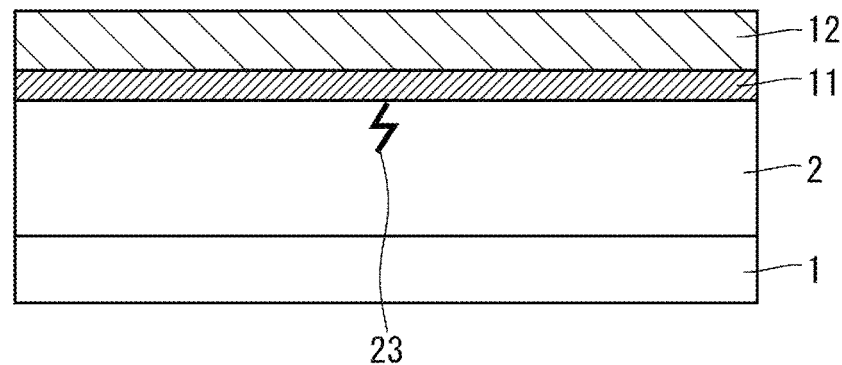
FIG. 31 is a sectional view for showing a mechanism of causing a spot breakdown relating to the embodiment.
Figure 32:
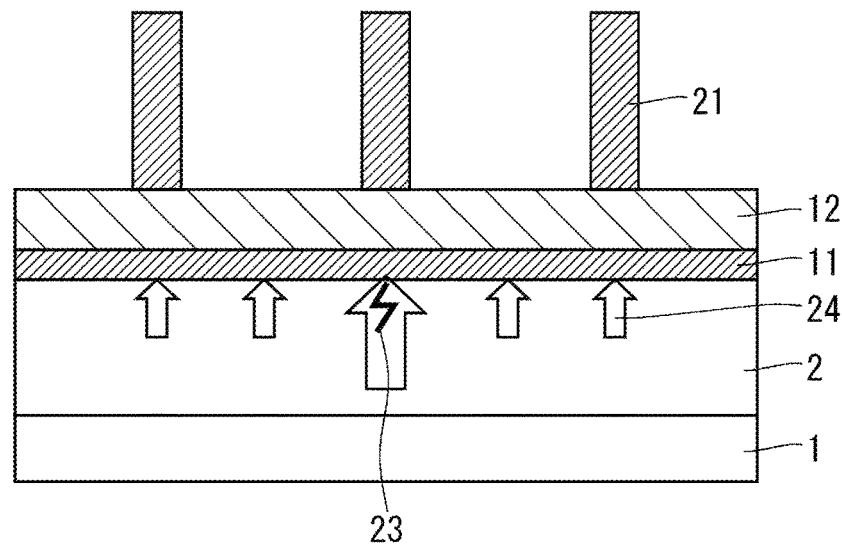
FIG. 32 is a sectional view for showing the mechanism of causing the spot breakdown relating to the embodiment.

FIGS. 31, 32, and 33 are sectional views for showing the mechanism of causing the spot breakdown.

As illustrated in FIG. 31, it is assumed that the crystal defect 23 occurs in the semiconductor device. A test is implemented on this semiconductor device by applying a high voltage.

More specifically, as illustrated in FIG. 32, the plurality of probe needles 21 contacts the upper surface of the anode electrode 12 of the semiconductor device. Then, a high voltage is applied through the probe needles 21.

Then, as illustrated in FIG. 32, a high leakage current 24 is generated and starts to flow from the crystal defect 23. The sizes of arrows indicating the leakage current 24 mean the approximate quantities of the leakage current.

As illustrated in FIG. 33, heat is generated at a position at which the high leakage current is generated. On the occurrence of positive feedback in which a leakage current is further generated at this position, thermal breakdown, specifically, the spot breakdown 22 is caused.

<Configuration of Semiconductor Device>

FIG. 1 is a sectional view schematically illustrating the configuration in part of the semiconductor device, more specifically, a Schottky barrier diode (SBD) relating to this embodiment. FIG. 2 is a plan view schematically illustrating the configuration in part of the semiconductor device relating to this embodiment. FIG. 1 corresponds to a sectional view taken along AB in FIG. 2.

FIG. 3 is a sectional view schematically illustrating the configuration in its entirety of the semiconductor device relating to this embodiment. A region X surrounded by dotted lines, specifically, an effective region in FIG. 3 corresponds to a range of the partial configuration illustrated in FIG. 1.

In terms of facilitating understanding of the configuration, some components may be omitted or simplified in the illustrations of FIGS. 1, 2, and 3.

The semiconductor device relating to this embodiment includes the $n^+$ type silicon carbide semiconductor substrate 1, the $n^-$ type epitaxial layer 2 formed on the upper surface of the $n^+$ type silicon carbide semiconductor substrate 1, the Schottky electrode 11 formed on the upper surface of the epitaxial layer 2, and the anode electrode 12 formed on the upper surface of the Schottky electrode 11. The Schottky electrode 11 is made of Ti, for example. In the below, the semiconductor device is described as a silicon carbide semiconductor device. However, the semiconductor device is not limited to a silicon carbide semiconductor device.

The semiconductor device relating to this embodiment includes a p-type semiconductor layer, specifically, an anode p-type region 3 formed in a part of the interior of the epitaxial layer 2 including a surface, specifically, in a part of the surface layer of the epitaxial layer 2 and joined in its entirety to the Schottky electrode 11. The anode p-type region 3 is a p-type region in its entirety within a contour in a plan view.

The Schottky electrode 11 is formed to cover the upper surface of the epitaxial layer 2 and the upper surface of the anode p-type region 3.

The anode p-type region 3 is formed in a layer below the anode electrode 12. Meanwhile, for the convenience of description, the anode p-type region 3 is illustrated in a perspective fashion in FIG. 2.

The configuration of the semiconductor device in its entirety relating to this embodiment illustrated in FIG. 3 includes the p-type terminal breakdown voltage holding layer 91 formed in the surface layer of the epitaxial layer 2 to surround the anode p-type region 3 in a plan view. The terminal breakdown voltage holding layer 91 is joined in a partial region to the Schottky electrode 11.

The configuration of the semiconductor device in its entirety relating to this embodiment illustrated in FIG. 3 includes the terminal protective film 92 formed to cover the Schottky electrode 11 and the anode electrode 12, and the cathode electrode 13 formed on the lower surface of the silicon carbide semiconductor substrate 1.

In the semiconductor device relating to this embodiment illustrated in FIG. 3, the anode electrode 12 has an upper surface to be contacted by the plurality of probe needles 21.

As illustrated in FIG. 3, each of the probe needles 21 is to contact a position overlapping a region in which the anode p-type region 3 is located in a plan view.

The anode p-type region 3 includes at least one anode p-type region 3 formed in a part of a Schottky junction area, specifically, on a part of the lower surface of the Schottky electrode 11. If there is a plurality of anode p-type regions 3, a distance between adjacent ones of the anode p-type regions 3 is greater than twice the width of a depletion layer to extend from the anode p-type regions 3 in response to application of a rated voltage in a direction opposite a forward direction.

Figure 4:
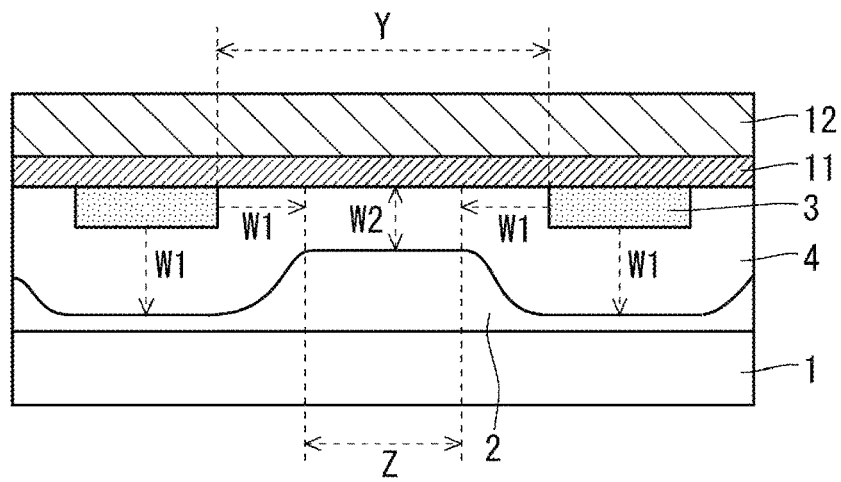
FIG. 4 is a sectional view for showing an arrangement interval between anode p-type regions relating to the embodiment.
Figure 5:
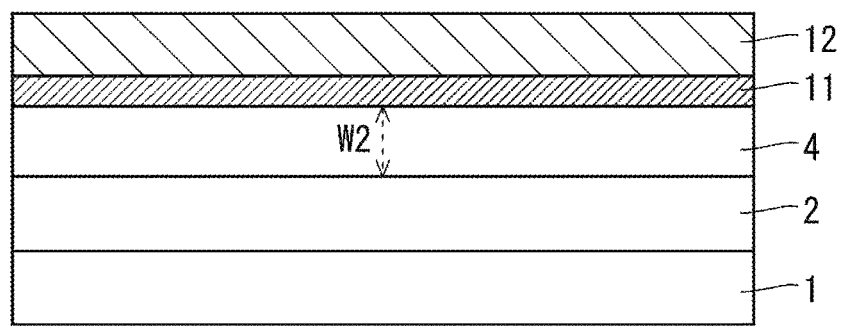
FIG. 5 is a sectional view for showing an arrangement interval between the anode p-type regions relating to the embodiment.
Figure 6:
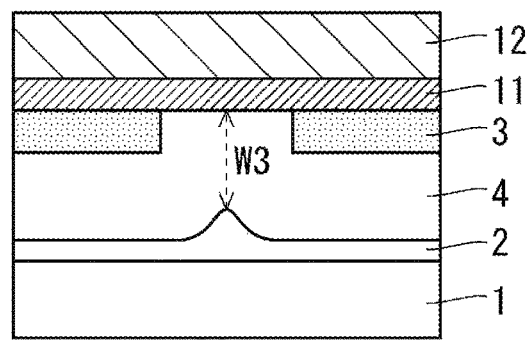
FIG. 6 is a sectional view for showing an arrangement interval between the anode p-type regions relating to the embodiment.

FIGS. 4, 5, and 6 are sectional views for showing an arrangement interval between the anode p-type regions 3. FIGS. 4, 5, and 6 illustrate a depletion layer 4 generated by application of a rated voltage in a direction opposite a forward direction.

As illustrated in FIG. 4, a distance Y between adjacent ones of the anode p-type regions 3 is greater than twice a width W1 of the depletion layer 4 to extend from the anode p-type regions 3 in response to application of a rated voltage in a direction opposite a forward direction.

A distance between the anode p-type region 3 and the terminal breakdown voltage holding layer 91 is also greater than twice the width W1 of the depletion layer 4 to extend from the anode p-type region 3 in response to application of a rated voltage in a direction opposite a forward direction.

By doing so, like in a configuration in FIG. 5 without a p-type region, a region Z in which the depletion layer 4 has a width W2 is formed, as illustrated in FIG. 4.

More specifically, assuming that a rated voltage is V, an epitaxial concentration is Nd, the width of the depletion layer 4 is W, a distance between adjacent ones of the anode p-type regions 3 is d, the permittivity of semiconductor is ε, and elementary charge is q, the following relationship is established:

$$D > 2W, \quad W = \sqrt{\frac{2\varepsilon V}{qNd}} \qquad \text{[Formula 1]}$$

If a short distance is set between adjacent ones of the anode p-type regions 3 like in a conventional JBS, specifically, in a configuration illustrated in FIG. 6, ON resistance is increased by increase in JFET resistance.

The reason for this is that, in response to application of a rated voltage in a direction opposite a forward direction, the depletion layer 4 extending in a direction in the plane of a semiconductor wafer from the anode p-type region 3 exerts influence also on the width of the depletion layer 4 in a region in which the anode p-type region 3 is not formed.

Specifically, the depletion layer 4 extending in the direction in the plane of the semiconductor wafer from a region in the presence of the anode p-type region 3 reaches the region in which the anode p-type region 3 is not formed. This unfortunately makes a width W3 of the depletion layer 4 in the region in which the anode p-type region 3 is not formed larger than the width W2 of the depletion layer 4 shown in FIG. 5.

As described above, a spot breakdown is caused by thermal breakdown due to a leakage current. Hence, the occurrence of a spot breakdown can be reduced in a configuration achieving reduction in a crystal defect as a starting point of a leakage current and a leakage current to flow near the crystal defect.

Regarding a silicon carbide semiconductor, if an electrode having a low Schottky barrier practical for a Schottky barrier diode is used, for example, if an electrode made of Ti and having a barrier height of about 0.95 eV is used, a leakage current becomes lower at a pn junction at which a barrier height is about 2.5 eV than at a Schottky junction as a result of a difference in a barrier height between the junctions and a difference in a mechanism of generating a leakage current between the junctions.

Thus, as illustrated in FIG. 1, in the presence of the anode p-type region 3 introduced into a Schottky junction area in the n-type Schottky barrier diode, a leakage current becomes lower at a pn junction formed by the anode p-type region 3 than at the Schottky junction area. As a result, the occurrence of a spot breakdown is reduced in the anode p-type region 3.

<Operation of Testing Semiconductor Device>

Described next is a test implemented by applying a high voltage to the semiconductor device relating to this embodiment using a probe needle. The test implemented by applying a high voltage mentioned herein means a test implemented by applying a voltage of 50 V or more in an opposite direction, for example.

Figure 7:
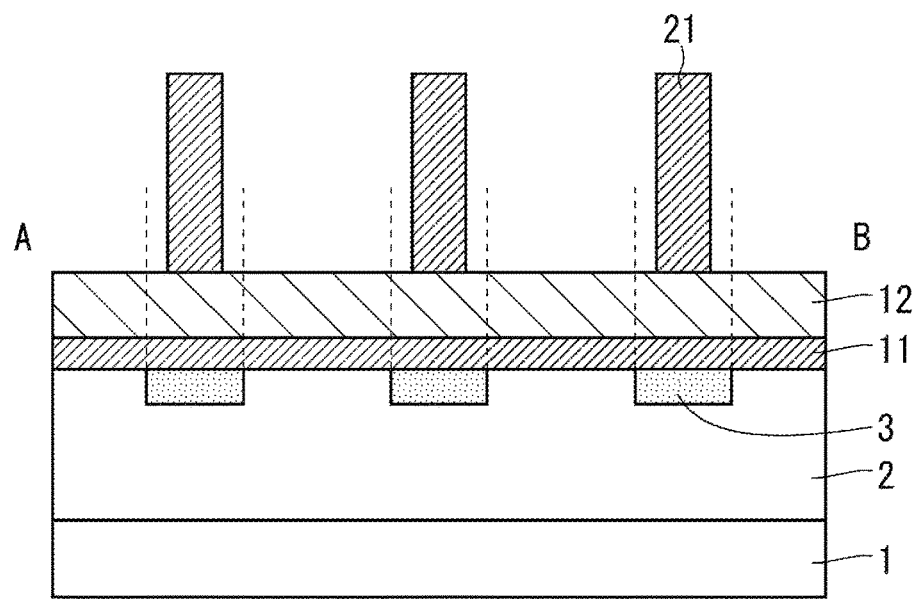
FIG. 7 is a sectional view schematically illustrating the configuration of the semiconductor device relating to the embodiment.
Figure 8:
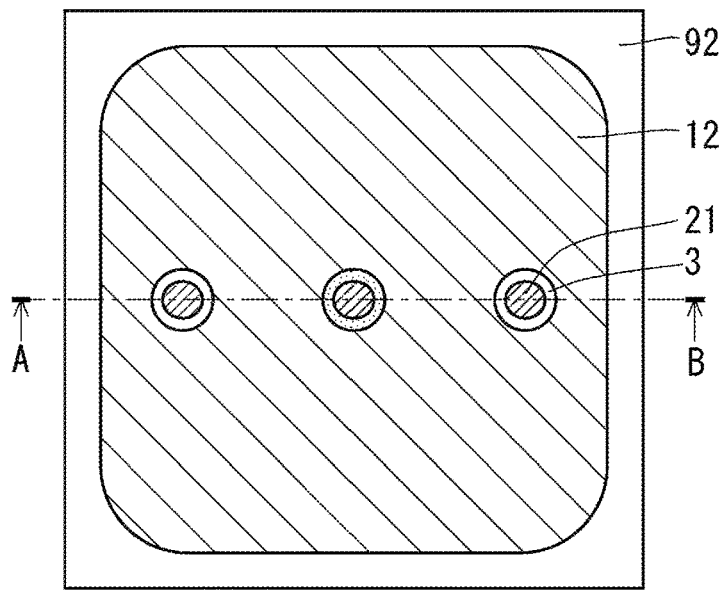
FIG. 8 is a plan view schematically illustrating the configuration of the semiconductor device relating to the embodiment.

As illustrated in FIGS. 7 and 8, for making measurement by applying the high voltage to the semiconductor device, the probe needle 21 is brought into contact with a range in which the anode p-type region 3 exists directly below the anode electrode 12. Specifically, the probe needle 21 is brought into contact with the upper surface of the anode electrode 12 in the range in which the contour of the anode p-type region 3 is formed in a plan view. As a result, a spot breakdown becomes unlikely to occur near the probe needle 21.

FIG. 7 is a sectional view schematically illustrating the configuration of the semiconductor device relating to this embodiment. FIG. 8 is a plan view schematically illustrating the configuration of the semiconductor device relating to this embodiment. FIG. 7 corresponds to a sectional view taken along AB in FIG. 8.

Thus, it becomes possible to suppress damage caused by a spot breakdown on the probe needle 21. As a result, necessity to interrupt the test and exchange the probe needle 21 can be eliminated.

Figure 9:
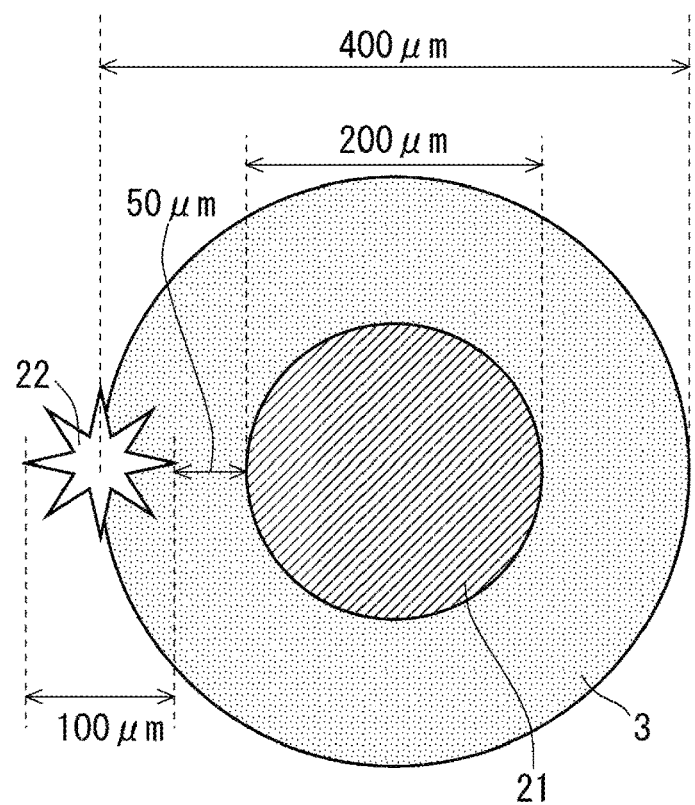
FIG. 9 illustrates a relationship between the size of the anode p-type region and the size of a probe needle in a cross section.

The size of the anode p-type region 3 is desirably larger than the size of the probe needle 21 in a cross section. As illustrated in FIG. 9 showing a relationship between the size of the anode p-type region 3 and the size of the probe needle 21 in a cross section, if the size of a range in which the spot breakdown 22 is to occur is 100 μm in diameter, the size of a region in which the probe needle 21 and the anode electrode 12 contact each other is 200 µm in diameter, and the probe needle 21 has accuracy of position of 50 µm, for example, the size of the anode p-type region 3 may be 400 µm or more.

An ON voltage is higher at the anode p-type region 3 than at the Schottky junction area. Hence, flowing a current in a forward direction increases the ON resistance of the Schottky barrier diode.

Thus, the anode p-type region 3 is desirably small in size. Desirably, the anode p-type region 3 has a minimum required size allowing protection of the probe needle 21.

During measurement, the probe needle 21 is not required to contact a region entirely in which the anode p-type region 3 is located below the electrode but may contact a part of the region in which the anode p-type region 3 is located. Meanwhile, the anode p-type region 3 increases the ON resistance of the Schottky barrier diode as described above, so that the number of the anode p-type regions 3 is desirably small. Desirably, the number of the p-type regions 3 is a minimum required number allowing protection of the probe needle 21.

Figure 10:
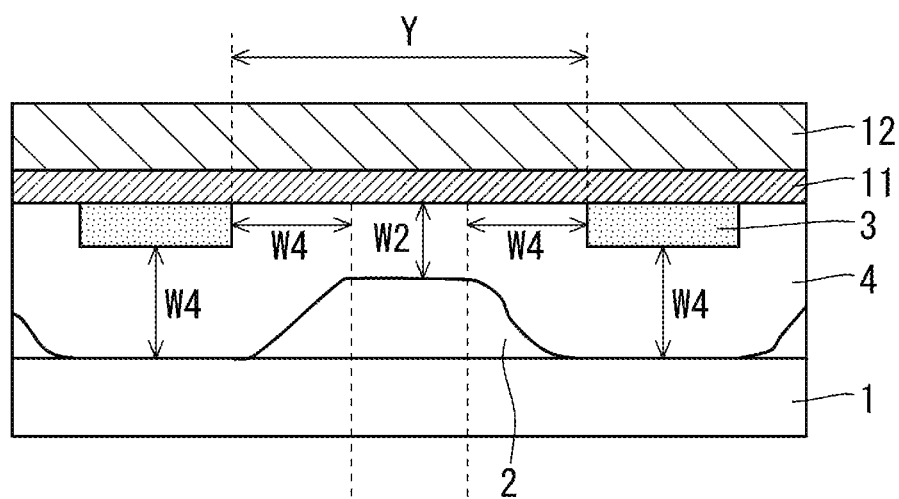
FIG. 10 is a sectional view for showing an arrangement interval between the anode p-type regions relating to the embodiment.
Figure 11:
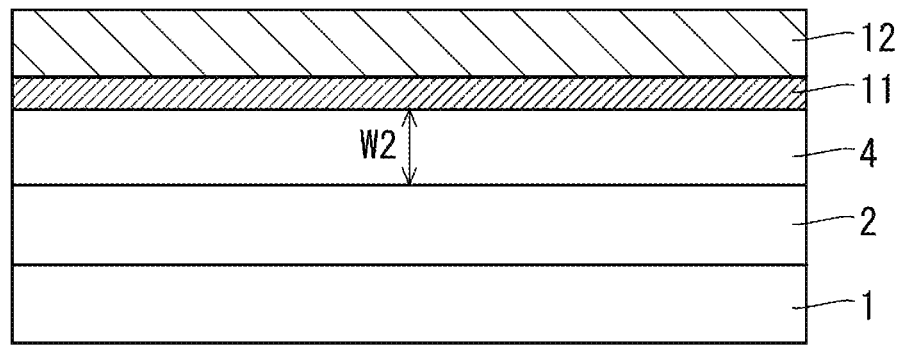
FIG. 11 is a sectional view for showing an arrangement interval between the anode p-type regions relating to the embodiment.

FIGS. 10 and 11 are sectional views for showing an arrangement interval between the anode p-type regions 3. FIGS. 10 and 11 illustrate the depletion layer 4 generated by application of a rated voltage in a direction opposite a forward direction.

As illustrated in FIG. 10, in the configuration of the semiconductor device relating to this embodiment, the distance Y between adjacent ones of the anode p-type regions 3, and the distance Y between the anode p-type region 3 and the terminal breakdown voltage holding layer 91, may be greater than twice a thickness W4 of the epitaxial layer 2 directly below the anode p-type region 3.

If the distance Y between adjacent ones of the anode p-type regions 3 is greater than twice the thickness W4 of the epitaxial layer 2 directly below the anode p-type region 3, in response to application of a rated voltage in a direction opposite a forward direction, an n-type region having the width W2 of a depletion layer like in a Schottky barrier diode in the absence of the anode p-type region 3 illustrated in FIG. 11 is partially formed without being influenced by the depletion layer extending in the direction in the plane of the wafer from the anode p-type region 3.

If the anode p-type regions 3 are arranged to be spaced at a wide interval therebetween, an operating region for the Schottky barrier diode can be extended. This makes it possible to achieve the effect of this embodiment while minimizing influence caused by increase in the ON resistance.

Figure 12:
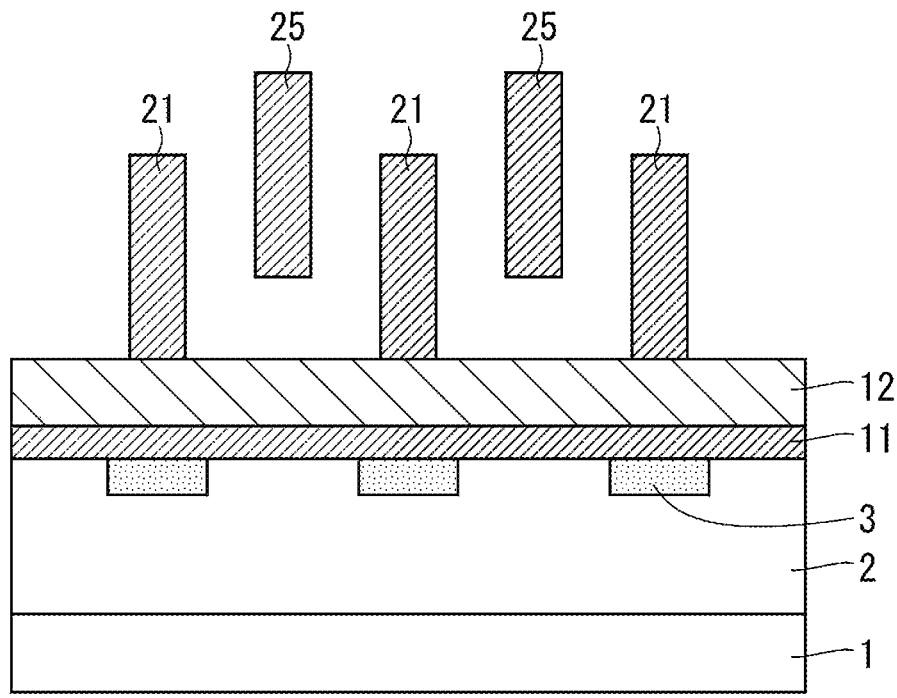
FIG. 12 is a sectional view illustrating how a test is implemented by applying a voltage using the semiconductor device relating to the embodiment.
Figure 13:
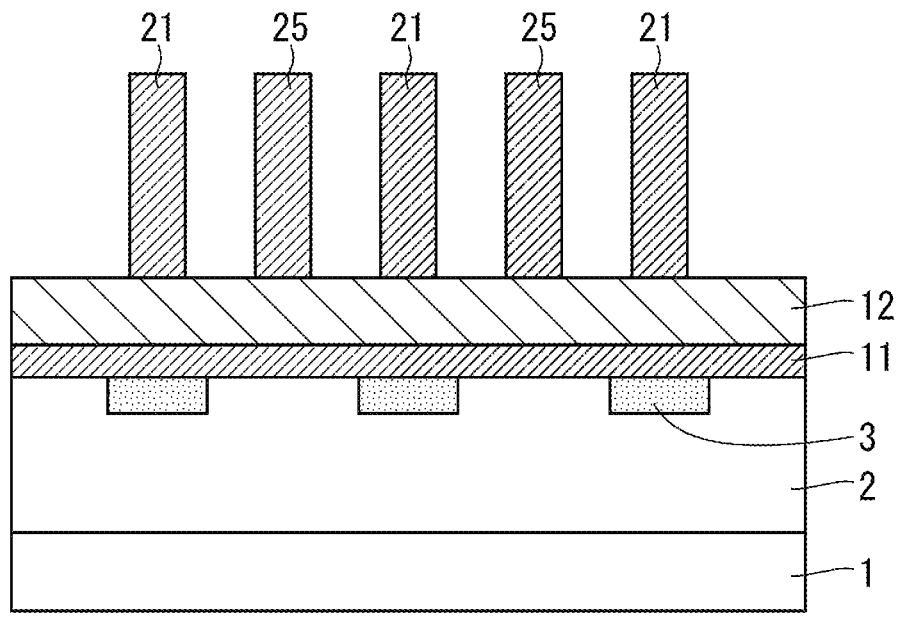
FIG. 13 is a sectional view illustrating how a test is implemented by applying a voltage using the semiconductor device relating to the embodiment.

FIGS. 12 and 13 are sectional views each illustrating how a test is implemented by applying a voltage using the semiconductor device of this embodiment.

As illustrated in FIG. 13, a measurement method using the semiconductor device of this embodiment may be a measurement method for measurement of a high current with a low voltage such as forward direction measurement implemented by bringing a probe needle 25 into contact with a region other than a region in which the anode p-type region 3 is formed. Measuring a high current with a low voltage mentioned herein means making measurement by applying a voltage of 0 V or more and 5 V or less in a forward direction, and causing a current of 1 A or more to flow as a rough indication of a current capacity in one probe needle 21.

A current quantity allowed to flow in one probe needle 21 is determined in advance, so that many probe needles 21 are required for measurement of a high current. Except for initial failure such as short circuit between an anode and a cathode, a spot breakdown does not occur during measurement of a high current with a low voltage. A chip subjected to initial failure can be removed by screening.

Thus, for measurement of a high current with a low voltage, a region to be contacted by the probe needle 21 is not required to be limited to a region above the position of the anode p-type region 3. Specifically, as illustrated in FIG. 13, contact by the probe needle 25 is allowed in addition to contact by the probe needle 21.

By contrast, for making measurement by applying a high voltage that might result in the occurrence of a spot breakdown, the measurement is made using probe needles of a number smaller than the number of probe needles used for measurement of a high current with a low voltage, as illustrated in FIG. 12.

As a result of the foregoing, the number of the anode p-type regions 3 for suppressing concentration of a leakage current can be reduced. As a result, reduction in the ON resistance is achieved.

Second Embodiment

A method of measuring a semiconductor device relating to a second embodiment will be described below. In the description given below, a structure similar to the structure described in the foregoing embodiment will be given the same sign and illustrated with the same sign in the drawings. Detailed description of this structure will be omitted, where appropriate.

<Configuration of Semiconductor Device>

Figure 14:
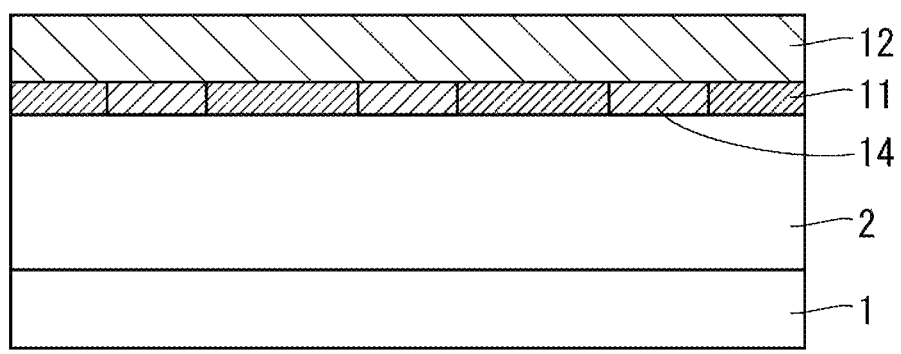
FIG. 14 is a sectional view schematically illustrating the configuration of the semiconductor device relating to the embodiment.

FIG. 14 is a sectional view schematically illustrating the configuration of a semiconductor device, more specifically, a Schottky barrier diode (SBD) relating to this embodiment. The configuration illustrated in FIG. 14 includes a high barrier Schottky electrode 14 having a higher Schottky barrier than the Schottky electrode 11 and provided as an alternative to the anode p-type region 3 in the configuration illustrated in the first embodiment. The high barrier Schottky electrode 14 is formed on the upper surface of the epitaxial layer 2. The high barrier Schottky electrode 14 may be configured to include a plurality of regions arranged in a concentric pattern in a plan view. The high barrier Schottky electrode 14 may alternatively be configured to include a single region having a concentric pattern, specifically, only a circular contour in a plan view.

In the foregoing configuration, the high barrier Schottky electrode 14 generates a leakage current lower than a leakage current generated by the Schottky electrode 11. Thus, the occurrence of a spot breakdown is reduced.

Figure 15:
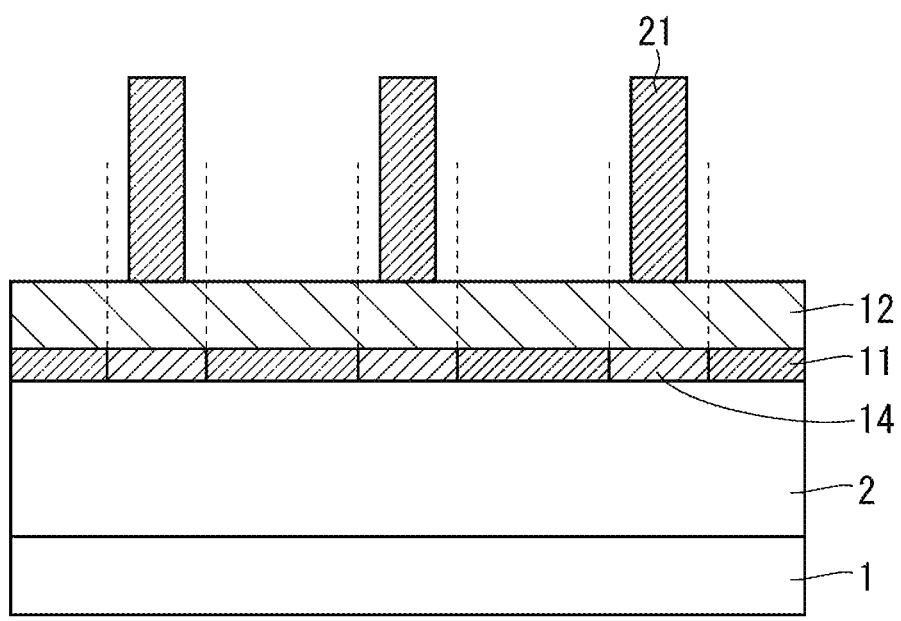
FIG. 15 is a sectional view schematically illustrating the configuration of the semiconductor device relating to the embodiment.

Thus, for making measurement by applying a high voltage to the semiconductor device, the probe needle 21 is brought into contact with a position at which the high barrier Schottky electrode 14 exists directly below the anode electrode 12, as illustrated in FIG. 15. As a result, the occurrence of a spot breakdown near the probe needle 21 is reduced. FIG. 15 is a sectional view schematically illustrating the configuration of the semiconductor device relating to this embodiment.

Thus, it becomes possible to suppress damage caused by a spot breakdown on the probe needle 21. As a result, necessity to interrupt a test and exchange the probe needle 21 can be eliminated.

The Schottky electrode 11 may be made of titanium (Ti) having a barrier height of 0.95 eV relative to 4H—SiC. The high barrier Schottky electrode 14 may be made of nickel (Ni) having a barrier height of 1.62 eV relative to 4H—SiC.

Like in the case of the first embodiment, the size of the high barrier Schottky electrode 14 is desirably larger than the size of the probe needle 21 in a cross section.

Figure 16:
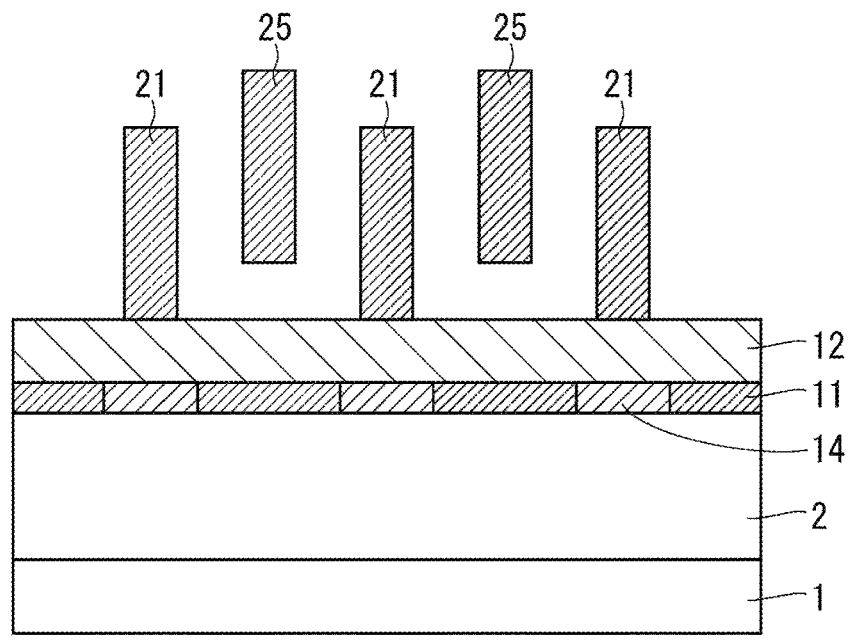
FIG. 16 is a sectional view illustrating how a test is implemented by applying a voltage using the semiconductor device relating to the embodiment.
Figure 17:
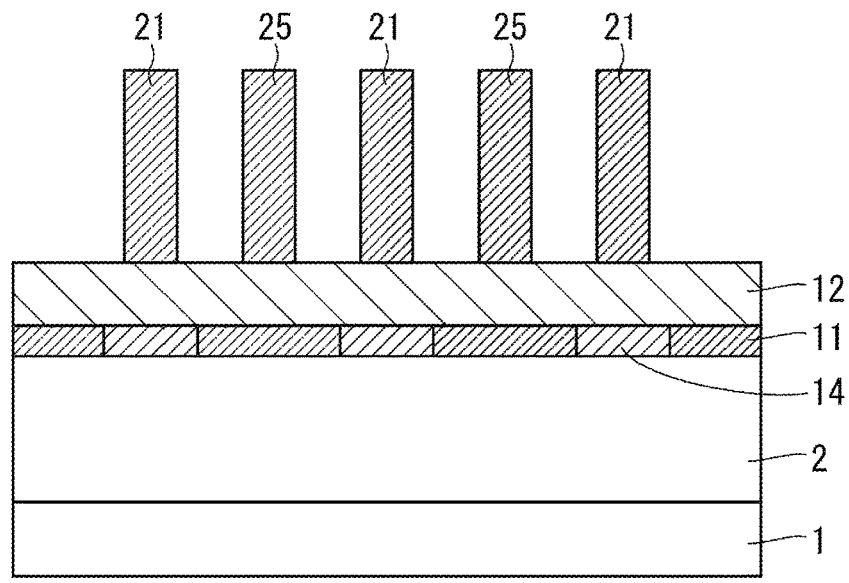
FIG. 17 is a sectional view illustrating how a test is implemented by applying a voltage using the semiconductor device relating to the embodiment.

FIGS. 16 and 17 are sectional views each illustrating how a test is implemented by applying a voltage using the semiconductor device of this embodiment.

As illustrated in FIG. 17, a measurement method using the semiconductor device relating to this embodiment may be a measurement method for measurement of a high current with a low voltage such as forward direction measurement implemented by bringing the probe needle 25 into contact with a region other than a region in which the high barrier Schottky electrode 14 is formed.

By contrast, for making measurement by applying a high voltage that might result in the occurrence of a spot breakdown, the measurement is made using probe needles of a number smaller than the number of probe needles used for measurement of a high current with a low voltage, as illustrated in FIG. 16.

As a result of the foregoing, the number of the high barrier Schottky electrodes 14 for suppressing concentration of a leakage current can be reduced. As a result, reduction in the ON resistance is achieved.

Third Embodiment

A method of measuring a semiconductor device relating to a third embodiment will be described below. In the description given below, a structure similar to the structure described in the foregoing embodiments will be given the same sign and illustrated with the same sign in the drawings. Detailed description of this structure will be omitted, where appropriate.

<Configuration of Semiconductor Device>

Figure 18:
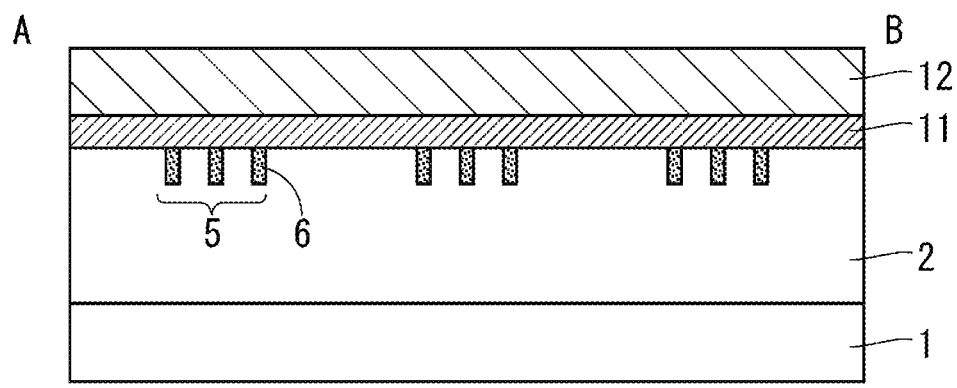
FIG. 18 is a sectional view schematically illustrating the configuration of the semiconductor device relating to the embodiment.
Figure 19:
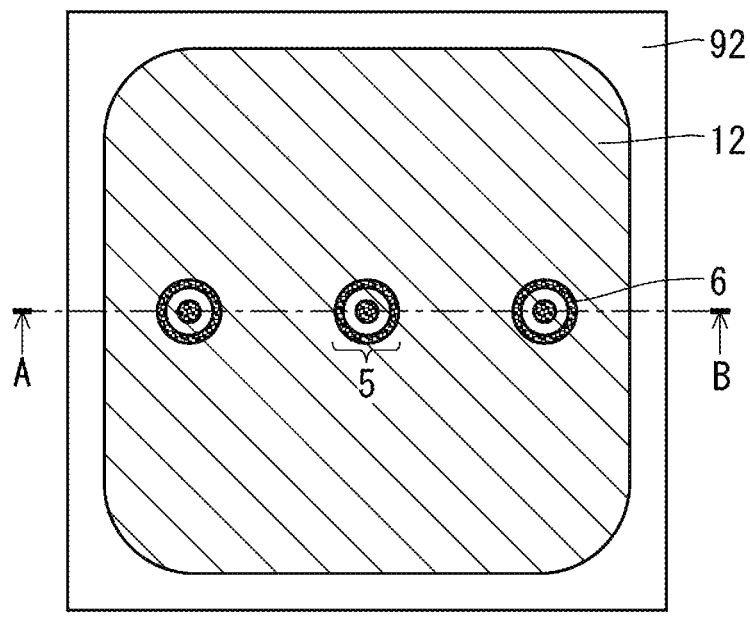
FIG. 19 is a plan view schematically illustrating the configuration of the semiconductor device relating to the embodiment.

FIG. 18 is a sectional view schematically illustrating the configuration of the semiconductor device, more specifically, a Schottky barrier diode (SBD) relating to this embodiment. FIG. 19 is a plan view schematically illustrating the configuration of the semiconductor device relating to this embodiment. FIG. 18 corresponds to a sectional view taken along AB in FIG. 19.

The configuration illustrated in FIG. 18 includes a JBS region 5 as an alternative to the anode p-type region 3 in the configuration illustrated in the first embodiment.

The JBS region 5 is formed in a layer below the anode electrode 12. Meanwhile, for the convenience of description, the JBS region 5 is illustrated in a perspective fashion in FIG. 19.

The JBS region 5 is a p-type region formed in the surface layer of the epitaxial layer 2 to be joined to the Schottky electrode 11. Like in the case illustrated in FIG. 6, a distance between adjacent ones of the JBS regions 5 is less than twice the width of a depletion layer to extend from the JBS regions 5 in response to application of a rated voltage in a direction opposite a forward direction.

The JBS region 5 includes a plurality of p-type regions 6 arranged in a concentric pattern in a plan view. Specifically, the JBS region 5 includes an n-type region surrounded by the p-type regions in a plan view. Alternatively, the JBS region 5 may be configured to include a single region having a concentric pattern, specifically, only a circular contour in a plan view. The formation of the JBS region 5 reduces the area of a Schottky junction. Further, the presence of a depletion layer extending in a direction in the plane of a wafer from the p-type regions 6 constituting the JBS region 5 reduces the intensity of an electric field applied to a Schottky junction in the JBS region 5. As a result of these configurations, a leakage current is reduced. Thus, the occurrence of a spot breakdown is reduced in the JBS region 5.

Figure 20:
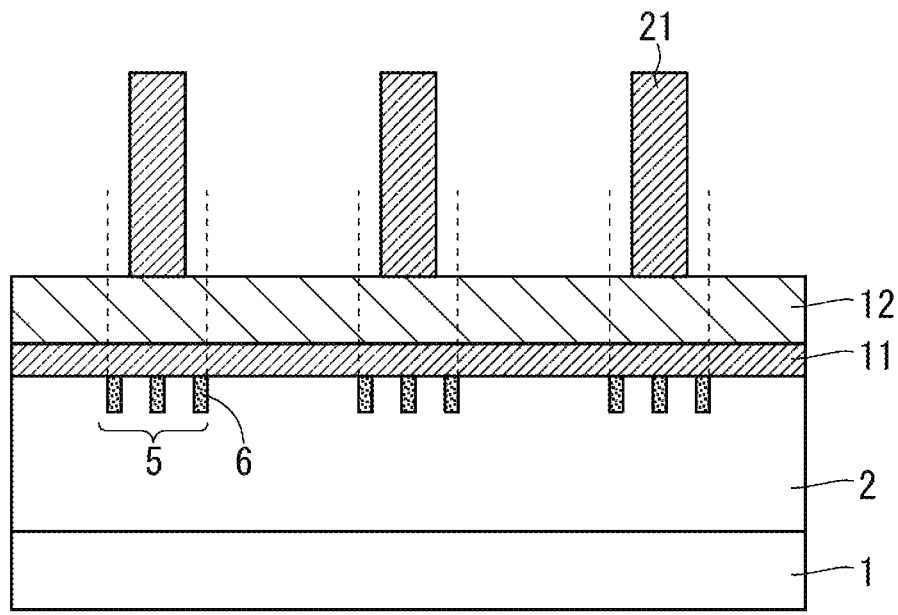
FIG. 20 is a sectional view schematically illustrating the configuration of the semiconductor device relating to the embodiment.

As illustrated in FIG. 20, for making measurement by applying a high voltage to the semiconductor device, the probe needle 21 is brought into contact with a position at which the JBS region 5 exists directly below the anode electrode 12. As a result, the occurrence of a spot breakdown near the probe needle 21 is reduced. FIG. 20 is a sectional view schematically illustrating the configuration of the semiconductor device relating to this embodiment.

Thus, it becomes possible to suppress damage caused by a spot breakdown on the probe needle 21. As a result, necessity to interrupt a test and exchange the probe needle 21 can be eliminated.

The size of the JBS region 5 is desirably larger than the size of the probe needle 21 in a cross section.

Figure 21:
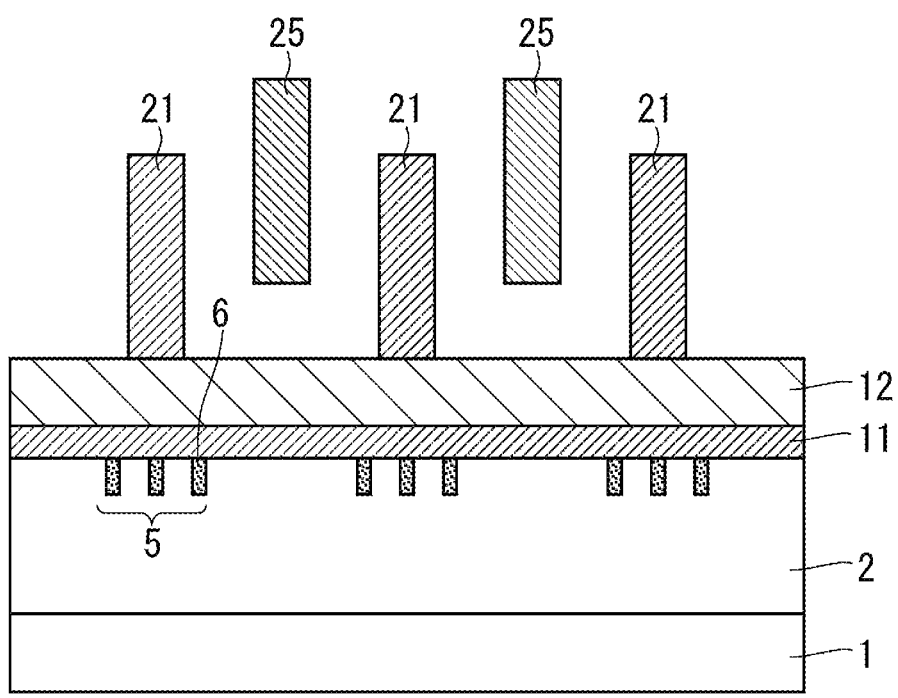
FIG. 21 is a sectional view illustrating how a test implemented by applying a voltage using the semiconductor device relating to the embodiment.

FIGS. 21 and 22 are sectional views each illustrating how a test is implemented by applying a voltage using the semiconductor device of this embodiment.

As illustrated in FIG. 22, a measurement method using the semiconductor device of this embodiment may be a measurement method for measurement of a high current with a low voltage such as forward direction measurement implemented by bringing the probe needle 25 into contact with a region other than a region in which the JBS region 5 is formed.

By contrast, for making measurement by applying a high voltage that might result in the occurrence of a spot breakdown, the measurement is made using probe needles of a number smaller than the number of probe needles used for measurement of a high current with a low voltage, as illustrated in FIG. 21.

As a result of the foregoing, the number of the JBS regions 5 for suppressing concentration of a leakage current can be reduced. As a result, reduction in the ON resistance is achieved.

Fourth Embodiment

A method of measuring a semiconductor device relating to a fourth embodiment will be described below. In the description given below, a structure similar to the structure described in the foregoing embodiments will be given the same sign and illustrated with the same sign in the drawings. Detailed description of this structure will be omitted, where appropriate.

<Configuration of Semiconductor Device>

Figure 24:
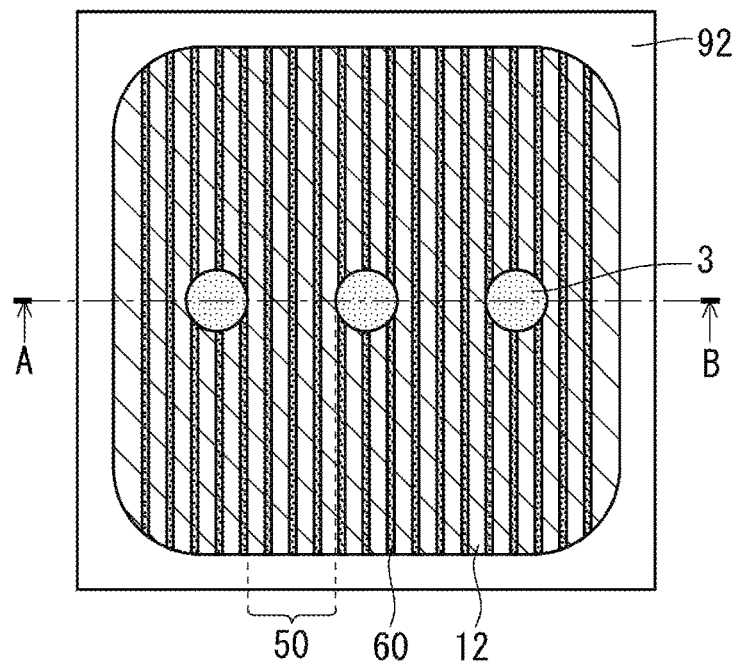
FIG. 24 is a plan view schematically illustrating the configuration of the semiconductor device relating to the embodiment.

FIG. 23 is a sectional view schematically illustrating the configuration of the semiconductor device, more specifically, a Schottky barrier diode (SBD) relating to this embodiment. FIG. 24 is a plan view schematically illustrating the configuration of the semiconductor device relating to this embodiment. FIG. 23 corresponds to a sectional view taken along AB in FIG. 24.

The configuration illustrated in FIG. 23 includes a JBS region 50 formed in a Schottky junction area, in addition to the configuration illustrated in the first embodiment.

The JBS region 50 is formed in a part of the surface layer of the epitaxial layer 2. The JBS region 50 includes a p-type region 60 contacting the Schottky electrode 11, and an n-type region contacting the Schottky electrode 11. The p-type region 60 and the n-type region are formed alternately in a sectional view. In the illustration of FIG. 24, the p-type region 60 constituting the JBS region 50 has a stripe shape.

The p-type region 60 constituting the JBS region 50 is formed to a width smaller than the width of the anode p-type region 3. A dopant concentration in the p-type region 60 is equal to or higher than a dopant concentration in the anode p-type region 3.

The JBS region 50 and the anode p-type region 3 are formed in a layer below the anode electrode 12. Meanwhile, for the convenience of description, the JBS region 50 and the anode p-type region 3 are illustrated in a perspective fashion in FIG. 24.

As described above, a leakage current is lower at a pn junction than at a Schottky junction. Thus, a leakage current becomes lower at the anode p-type region 3 having a pn junction than at the JBS region 50 having both a Schottky junction and a pn junction. In this way, the occurrence of a spot breakdown is reduced in the anode p-type region 3.

Figure 25:
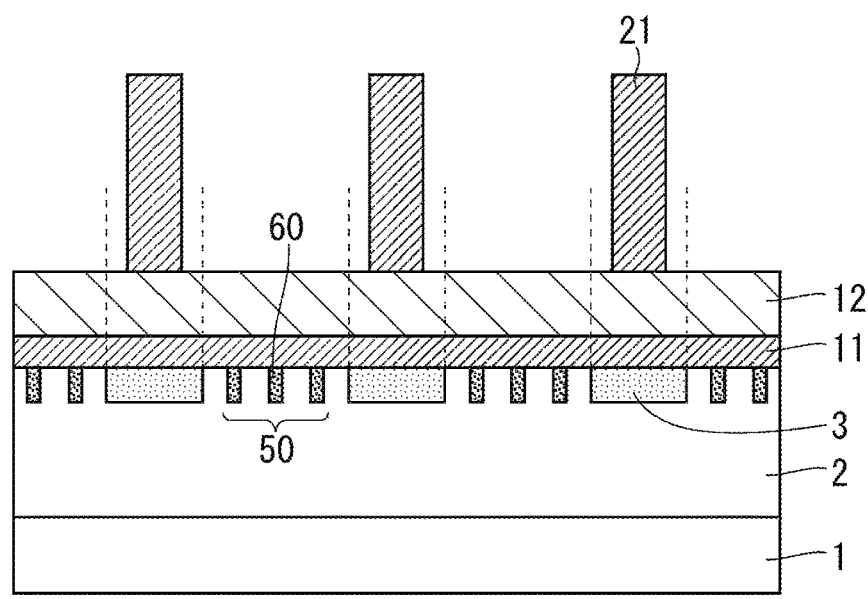
FIG. 25 is a sectional view schematically illustrating the configuration of the semiconductor device relating to the embodiment.

As illustrated in FIG. 25, for making measurement by applying a high voltage to the semiconductor device, the probe needle 21 is brought into contact with a position at which the anode p-type region 3 exists directly below the anode electrode 12. As a result, the occurrence of a spot breakdown near the probe needle 21 is reduced. FIG. 25 is a sectional view schematically illustrating the configuration of the semiconductor device relating to this embodiment.

Thus, it becomes possible to suppress damage caused by a spot breakdown on the probe needle 21. As a result, necessity to interrupt a test and exchange the probe needle 21 can be eliminated.

Meanwhile, if a dopant concentration in the anode p-type region 3 increases, electric field intensity at a pn junction area is increased to increase a leakage current in the anode p-type region 3. Thus, a dopant concentration in the anode p-type region 3 is required to be equal to or lower than a dopant concentration in the p-type region 60 constituting the JBS region 50.

Like in the first embodiment, a range in which the anode p-type region 3 is formed is desirably greater than the size of the probe needle 21.

Figure 26:
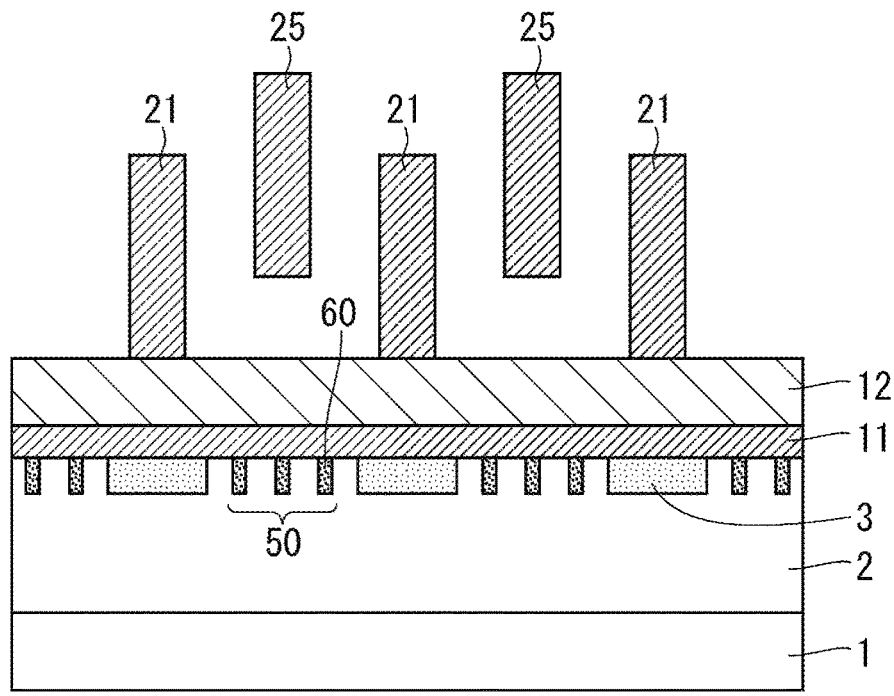
FIG. 26 is a sectional view illustrating how a test is implemented by applying a voltage using the semiconductor device relating to the embodiment.
Figure 27:
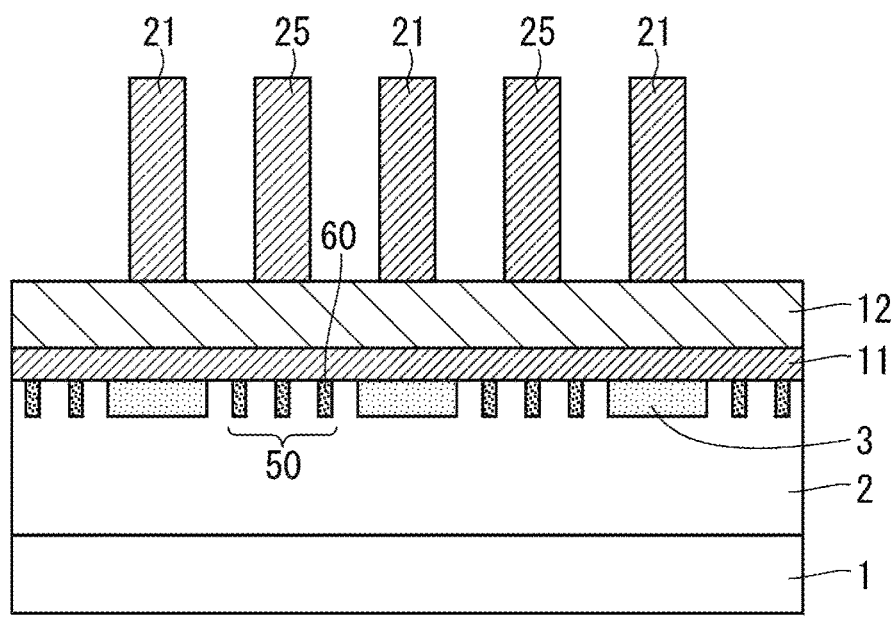
FIG. 27 is a sectional view illustrating how a test is implemented by applying a voltage using the semiconductor device relating to the embodiment.

FIGS. 26 and 27 are sectional views each illustrating how a test is implemented by applying a voltage using the semiconductor device of this embodiment.

As illustrated in FIG. 27, a measurement method using the semiconductor device of this embodiment may be a measurement method for measurement of a high current with a low voltage such as forward direction measurement implemented by bringing the probe needle 25 into contact with a region other than a region in which the JBS region 50 is formed.

By contrast, for making measurement by applying a high voltage that might result in the occurrence of a spot breakdown, the measurement is made using probe needles of a number smaller than the number of probe needles used for measurement of a high current with a low voltage, as illustrated in FIG. 26.

As a result of the foregoing, the number of the JBS regions 50 for suppressing concentration of a leakage current can be reduced. As a result, reduction in the ON resistance is achieved.

Effect Achieved by Foregoing Embodiments

Exemplary effects achieved by the foregoing embodiments will be described next. These effects in the following description are achieved based on the specific configurations illustrated in the foregoing embodiments. However, these configurations may be replaced by different specific configurations illustrated in the description of the present application, as long as comparable effects are achieved by such different specific configurations.

This replacement may be done across a plurality of embodiments. Specifically, configurations illustrated in different embodiments may be combined to achieve comparable effects.

According to the foregoing embodiments, in a method of measuring the semiconductor device, a voltage is applied while the probe needle 21 is brought into contact with the upper surface of the anode electrode 12 in a range in which the contour of at least one second conductivity type region is formed in a plan view. The second conductivity type region corresponds to the anode p-type region 3, for example. The silicon carbide semiconductor device used for the measurement includes the silicon carbide semiconductor substrate 1 of the first conductivity type, the epitaxial layer 2 of the first conductivity type, at least one anode p-type region 3 of the second conductivity type, the Schottky electrode 11, the anode electrode 12, and the cathode electrode 13. The epitaxial layer 2 is formed on the upper surface of the silicon carbide semiconductor substrate 1. The anode p-type region 3 is formed in a part of the surface layer of the epitaxial layer 2 to have a contour. The Schottky electrode 11 is formed to cover the upper surface of the epitaxial layer 2 and the upper surface of the anode p-type region 3. The anode electrode 12 is formed on the upper surface of the Schottky electrode 11. The cathode electrode 13 is formed on the lower surface of the silicon carbide semiconductor substrate 1.

The foregoing configuration makes it possible to reduce the occurrence of a spot breakdown near the probe needle. More specifically, for a test implemented by applying a high voltage, the probe needle 21 is brought into contact with a region in which the anode p-type region 3 is located in a plan view. A pn junction is capable of reducing a leakage current, compared to a leakage current flowing in a Schottky junction, so that concentration of a leakage current can be suppressed around the probe needle 21. This reduces the occurrence of a spot breakdown around the probe needle 21 to be caused by concentration of a leakage current, so that the probe needle 21 becomes less likely to be damaged by a spot breakdown. As a result, a workload of interrupting the test and exchanging the probe needle 21 can be reduced.

Structures illustrated in the description of the present application different from the structures described above can be omitted, where appropriate. Specifically, the foregoing effects are achieved only by the configurations described above.

Meanwhile, if at least one of the different structures illustrated in the description of the present application, specifically, a different one of the structures illustrated in the description of the present application and not listed as one of the foregoing structures is added to the foregoing structures, effects comparable to the foregoing effects are still achieved.

According to the foregoing embodiments, for application of a voltage higher than a threshold to the silicon carbide semiconductor device, the probe needle 21 is brought into contact with the upper surface of the anode electrode 12 only in a range in which the contour of the at least one anode p-type region 3 is formed in a plan view. For application of a voltage lower than the threshold to the silicon carbide semiconductor device, the probe needle 21 is brought into contact with the upper surface of the anode electrode 12 in the range in which the contour of the at least one anode p-type region 3 is formed in a plan view. Further, the probe needle 25 is brought into contact with the upper surface of the anode electrode 12 in a range in which the anode p-type region 3 is not formed in a plan view. In this configuration, if a voltage lower than the threshold is to be applied to the silicon carbide semiconductor device, for example, the probe needle 21 can be brought into contact further with the upper surface of the anode electrode 12 in the range in which the anode p-type region 3 is not formed in a plan view for implementation of a test. This makes it possible to reduce the number of positions at which the anode p-type regions 3 for suppressing concentration of a leakage current are to be formed. As a result, reduction in the ON resistance of the silicon carbide semiconductor device is achieved.

According to the foregoing embodiments, the anode p-type region 3 is a region of the second conductivity type in its entirety within a contour in a plan view. In this configuration, a leakage current is unlikely to be concentrated around the probe needle 21 contacting a position corresponding to a position at which the anode p-type region 3 is formed. This reduces the occurrence of a spot breakdown around the probe needle 21 to be caused by concentration of a leakage current, so that the probe needle 21 becomes less likely to be damaged by a spot breakdown. As a result, a workload of interrupting a test and exchanging the probe needle 21 can be reduced.

According to the foregoing embodiments, the silicon carbide semiconductor device includes at least one JBS region 50 of the second conductivity type. The JBS region 50 is formed in a part of the surface layer of the epitaxial layer 2. The JBS region 50 includes a region of the second conductivity type contacting the Schottky electrode 11, and a region of the first conductivity type contacting the Schottky electrode 11. The region of the second conductivity type constituting the JBS region 50, specifically, the p-type region 60 is formed to a width smaller than the width of the anode p-type region 3. A dopant concentration in the JBS region 50 is higher than a dopant concentration in the anode p-type region 3. In this configuration, a leakage current is unlikely to be concentrated around the probe needle 21 contacting a position corresponding to a position at which the anode p-type region 3 is formed. This reduces the occurrence of a spot breakdown around the probe needle 21 to be caused by concentration of a leakage current, so that the probe needle 21 becomes less likely to be damaged by a spot breakdown. As a result, a workload of interrupting a test and exchanging the probe needle 21 can be reduced.

According to the foregoing embodiments, the second conductivity type region includes a region of the first conductivity type surrounded by a region of the second conductivity type in a plan view. The second conductivity type region corresponds to the JBS region 5, for example. In this configuration, a leakage current is unlikely to be concentrated around the probe needle 21 contacting a position corresponding to a position at which the JBS region 5 is formed. This reduces the occurrence of a spot breakdown around the probe needle 21 to be caused by concentration of a leakage current, so that the probe needle 21 becomes less likely to be damaged by a spot breakdown. As a result, a workload of interrupting a test and exchanging the probe needle 21 can be reduced.

According to the foregoing embodiments, in a method of measuring the semiconductor device, a voltage is applied while the probe needle 21 is brought into contact with the upper surface of the anode electrode 12 in a range in which at least one second Schottky electrode is formed in a plan view. The second Schottky electrode corresponds to the high barrier Schottky electrode 14, for example. The silicon carbide semiconductor device used for the measurement includes the silicon carbide semiconductor substrate 1 of the first conductivity type, the epitaxial layer 2 of the first conductivity type, a first Schottky electrode, the high barrier Schottky electrode 14, the anode electrode 12, and the cathode electrode 13. The first Schottky electrode corresponds to the Schottky electrode 11, for example. The epitaxial layer 2 of the first conductivity type is formed on the upper surface of the silicon carbide semiconductor substrate 1. The Schottky electrode 11 includes at least one Schottky electrode 11 formed on the upper surface of the epitaxial layer 2. The high barrier Schottky electrode 14 includes at least one high barrier Schottky electrode 14 formed on the upper surface of the epitaxial layer 2. The high barrier Schottky electrode 14 forms a Schottky barrier between the high barrier Schottky electrode 14 and the epitaxial layer 2 higher than a Schottky barrier formed between the Schottky electrode 11 and the epitaxial layer 2. The anode electrode 12 is formed on the upper surface of the Schottky electrode 11 and the upper surface of the high barrier Schottky electrode 14. The cathode electrode 13 is formed on the lower surface of the silicon carbide semiconductor substrate 1.

The foregoing configuration makes it possible to reduce the occurrence of a spot breakdown near the probe needle. More specifically, for a test implemented by applying a high voltage, the probe needle 21 is brought into contact with a region in which the high barrier Schottky electrode 14 is located in a plan view. A pn junction is capable of reducing a leakage current, compared to a leakage current flowing in a Schottky junction, so that concentration of a leakage current can be suppressed around the probe needle 21. This reduces the occurrence of a spot breakdown around the probe needle 21 to be caused by concentration of a leakage current, so that the probe needle 21 becomes less likely to be damaged by a spot breakdown. As a result, a workload of interrupting the test and exchanging the probe needle 21 can be reduced.

Structures illustrated in the description of the present application different from the structures described above can be omitted, where appropriate. Specifically, the foregoing effects are achieved only by the configurations described above.

Meanwhile, if at least one of the different structures illustrated in the description of the present application, specifically, a different one of the structures illustrated in the description of the present application and not listed as one of the foregoing structures is added to the foregoing structures, effects comparable to the foregoing effects are still achieved.

Unless otherwise specified, order of performing each process is changeable.

According to the foregoing embodiments, for application of a voltage higher than a threshold to the silicon carbide semiconductor device, the probe needle 21 is brought into contact with the upper surface of the anode electrode 12 only in a range in which the at least one high barrier Schottky electrode 14 is formed in a plan view. For application of a voltage lower than the threshold to the silicon carbide semiconductor device, the probe needle 21 is brought into contact with the upper surface of the anode electrode 12 in the range in which the at least one high barrier Schottky electrode 14 is formed in a plan view. Further, the probe needle 25 is brought into contact with the upper surface of the anode electrode 12 in a range in which the high barrier Schottky electrode 14 is not formed in a plan view. In this configuration, if a voltage lower than the threshold is to be applied to the silicon carbide semiconductor device, for example, the probe needle 21 can be brought into contact further with the upper surface of the anode electrode 12 in the range in which the high barrier Schottky electrode 14 is not formed in a plan view for implementation of a test. This makes it possible to reduce the number of positions at which the high barrier Schottky electrodes 14 for suppressing concentration of a leakage current are to be formed. As a result, reduction in the ON resistance of the silicon carbide semiconductor device is achieved.

Modifications of Foregoing Embodiments

In the foregoing embodiments, components may be described from the viewpoint of a material quantity, a material, a dimension, a shape, arrangement relative to each other, or a condition for implementation, for example. These are in all aspects illustrative and not restrictive, and the components are not limited to these viewpoints given in the description of the present application.

Thus, numerous modifications and equivalents not illustrated are assumed to be included within the technical scope disclosed in the description of the present application. These modifications include a modification, addition, or omission of at least one component, and extraction of at least one component from at least one embodiment and combination of the extracted component with a component in a different embodiment, for example.

As long as no contradiction is to occur, a component described in a "singular form" in the foregoing embodiments may include "one or more" such components.

Further, each component described in each of the foregoing embodiments is a conceptual unit. The technical scope disclosed in the description of the present application covers a case where one component is formed of a plurality of structures, a case where one component corresponds to a part of some structure, and a case where a plurality of components is provided in one structure.

Each component described in each of the foregoing embodiments includes a structure having a different configuration or a different shape, as long as such a structure fulfills the same function.

The explanation given in the description of the present application should in all aspects be referred to for all purposes relating to the technique in the description of the present application and should never be recognized as a background art.

In the foregoing embodiments, if the name of a material is given without particular designation, for example, this material includes a material such as an alloy containing a different additive, as long as no contradiction is to occur.

EXPLANATION OF REFERENCE SIGNS

1 Silicon carbide semiconductor device
2 Epitaxial layer
3 Anode p-type region
4 Depletion layer
5, 50 JBS region
6, 60 P-type region
11 Schottky electrode
12 Anode electrode
13 Cathode electrode
14 High barrier Schottky electrode
21, 25 Probe needle
22 Spot breakdown
23 Crystal defect
24 Leakage current
91 Terminal breakdown voltage holding layer
92 Terminal protective film
W1, W2, W3 Width
W4 Film thickness
X, Z Region
Y Distance

The invention claimed is:

1. A method of measuring a semiconductor device implemented by applying a voltage to the semiconductor device using a probe needle, wherein
the semiconductor device comprises:
a semiconductor substrate of a first conductivity type;
an epitaxial layer of the first conductivity type formed on the upper surface of the semiconductor substrate;
at least one second conductivity type region of a second conductivity type formed in a part of the surface layer of the epitaxial layer to have a contour;
a Schottky electrode formed to cover the upper surface of the epitaxial layer and the upper surface of the second conductivity type region;
an anode electrode formed on the upper surface of the Schottky electrode; and
a cathode electrode formed on the lower surface of the semiconductor substrate,
a voltage is applied while the probe needle is brought into contact with the upper surface of the anode electrode in a range in which the contour of the at least one second conductivity type region is formed in a plan view, and
for application of a voltage lower than a threshold to the semiconductor device, the probe needle is brought into contact with the upper surface of the anode electrode in the range in which the contour of the at least one second conductivity type region is formed in a plan view, and is further brought into contact with the upper surface of the anode electrode in a range in which the second conductivity type region is not formed in a plan view.

2. The method of measuring a semiconductor device according to claim 1, wherein
the second conductivity type region is a region of the second conductivity type in its entirety within the contour in a plan view.

3. The method of measuring a semiconductor device according to claim 1, wherein
the second conductivity type region includes a region of the first conductivity type surrounded by a region of the second conductivity type in a plan view.

4. A method of measuring a semiconductor device implemented by applying a voltage to the semiconductor device using a probe needle, wherein
the semiconductor device comprises:
a semiconductor substrate of a first conductivity type;
an epitaxial layer of the first conductivity type formed on the upper surface of the semiconductor substrate;
at least one second conductivity type region of a second conductivity type formed in a part of the surface layer of the epitaxial layer to have a contour;
a Schottky electrode formed to cover the upper surface of the epitaxial layer and the upper surface of the second conductivity type region;
an anode electrode formed on the upper surface of the Schottky electrode; and
a cathode electrode formed on the lower surface of the semiconductor substrate, and
a voltage is applied while the probe needle is brought into contact with the upper surface of the anode electrode in a range in which the contour of the at least one second conductivity type region is formed in a plan view,
for application of a voltage higher than a threshold to the semiconductor device, the probe needle is brought into contact with the upper surface of the anode electrode only in a range in which the contour of the at least one second conductivity type region is formed in a plan view, and for application of a voltage lower than the threshold to the semiconductor device, the probe needle is brought into contact with the upper surface of the anode electrode in the range in which the contour of the at least one second conductivity type region is formed in a plan view, and is further brought into contact with the upper surface of the anode electrode in a range in which the second conductivity type region is not formed in a plan view.

5. The method of measuring a semiconductor device according to claim 4, wherein
the second conductivity type region is a region of the second conductivity type in its entirety within the contour in a plan view.

6. The method of measuring a semiconductor device according to claim 4, wherein
the second conductivity type region includes a region of the first conductivity type surrounded by a region of the second conductivity type in a plan view.

7. A method of measuring a semiconductor device implemented by applying a voltage to the semiconductor device using a probe needle, wherein
the semiconductor device comprises:
a semiconductor substrate of a first conductivity type;
an epitaxial layer of the first conductivity type formed on the upper surface of the semiconductor substrate;
at least one second conductivity type region of a second conductivity type formed in a part of the surface layer of the epitaxial layer to have a contour;
a Schottky electrode formed to cover the upper surface of the epitaxial layer and the upper surface of the second conductivity type region;
an anode electrode formed on the upper surface of the Schottky electrode; and
a cathode electrode formed on the lower surface of the semiconductor substrate, and
a voltage is applied while the probe needle is brought into contact with the upper surface of the anode electrode in a range in which the contour of the at least one second conductivity type region is formed in a plan view,
the second conductivity type region is a region of the second conductivity type in its entirety within the contour in a plan view, and
the semiconductor device further comprises:
at least one junction barrier controlled Schottky diode region of the second conductivity type formed in a part of the surface layer of the epitaxial layer, and including a region of the second conductivity type contacting the Schottky electrode and a region of the first conductivity type contacting the Schottky electrode,
the region of the second conductivity type constituting the junction barrier controlled Schottky diode region is formed to a width smaller than the width of the second conductivity type region, and
a dopant concentration in the junction barrier controlled Schottky diode region is higher than a dopant concentration in the second conductivity type region.

8. A method of measuring a semiconductor device implemented by applying a voltage to the semiconductor device using a probe needle, wherein
the semiconductor device comprises:
a semiconductor substrate of a first conductivity type;
an epitaxial layer of the first conductivity type formed on the upper surface of the semiconductor substrate;
at least one first Schottky electrode formed on the upper surface of the epitaxial layer;
at least one second Schottky electrode formed on the upper surface of the epitaxial layer and forming a Schottky barrier between the second Schottky electrode and the epitaxial layer higher than a Schottky barrier formed between the first Schottky electrode and the epitaxial layer;
an anode electrode formed on the upper surface of the first Schottky electrode and the upper surface of the second Schottky electrode; and
a cathode electrode formed on the lower surface of the semiconductor substrate,
a voltage is applied while the probe needle is brought into contact with the upper surface of the anode electrode in a range in which the at least one second Schottky electrode is formed in a plan view, and
for application of a voltage lower than a threshold to the semiconductor device, the probe needle is brought into contact with the upper surface of the anode electrode in a range in which the at least one second Schottky electrode is formed in a plan view, and is further brought into contact with the upper surface of the anode electrode in a range in which the second Schottky electrode is not formed in a plan view.

9. A method of measuring a semiconductor device implemented by applying a voltage to the semiconductor device using a probe needle, wherein
the semiconductor device comprises:
a semiconductor substrate of a first conductivity type;
an epitaxial layer of the first conductivity type formed on the upper surface of the semiconductor substrate;
at least one first Schottky electrode formed on the upper surface of the epitaxial layer;
at least one second Schottky electrode formed on the upper surface of the epitaxial layer and forming a Schottky barrier between the second Schottky electrode and the epitaxial layer higher than a Schottky barrier formed between the first Schottky electrode and the epitaxial layer;
an anode electrode formed on the upper surface of the first Schottky electrode and the upper surface of the second Schottky electrode; and
a cathode electrode formed on the lower surface of the semiconductor substrate, and
a voltage is applied while the probe needle is brought into contact with the upper surface of the anode electrode in a range in which the at least one second Schottky electrode is formed in a plan view,
for application of a voltage higher than a threshold to the semiconductor device, the probe needle is brought into contact with the upper surface of the anode electrode only in a range in which the at least one second Schottky electrode is formed in a plan view, and
for application of a voltage lower than the threshold to the semiconductor device, the probe needle is brought into contact with the upper surface of the anode electrode in the range in which the at least one second Schottky electrode is formed in a plan view, and is further brought into contact with the upper surface of the anode electrode in a range in which the second Schottky electrode is not formed in a plan view.

\* \* \* \* \*